United States Patent
Edelman

(10) Patent No.: US 6,901,282 B2
(45) Date of Patent: *May 31, 2005

(54) SCOUTLESS WHOLE-BODY IMAGING WITH FAST POSITIONING

(75) Inventor: Robert R. Edelman, Highland Park, IL (US)

(73) Assignee: Evanston Northwestern Healthcare, Inc., Evanston, IL (US)

( * ) Notice: Subject to any disclaimer, the term of this patent is extended or adjusted under 35 U.S.C. 154(b) by 327 days.

This patent is subject to a terminal disclaimer.

(21) Appl. No.: 10/357,967

(22) Filed: Feb. 4, 2003

(65) Prior Publication Data

US 2003/0135106 A1 Jul. 17, 2003

Related U.S. Application Data

(63) Continuation-in-part of application No. 09/999,583, filed on Oct. 25, 2001.

(51) Int. Cl.⁷ .............................................. A61B 5/055
(52) U.S. Cl. ...................... 600/420; 324/307; 324/309; 600/415; 382/128; 382/130
(58) Field of Search ................................ 600/410, 415, 600/419, 420, 421, 422, 425, 431; 324/307, 306, 309, 318, 322, 312; 382/128, 131

(56) References Cited

U.S. PATENT DOCUMENTS

| | | | |
|---|---|---|---|
| 4,703,267 A | | 10/1987 | Maudsley |
| 4,730,267 A | * | 3/1988 | Hughes ...................... 708/833 |
| 4,791,567 A | * | 12/1988 | Cline et al. .................. 345/424 |
| 4,800,889 A | | 1/1989 | Dumoulin et al. |
| 4,851,779 A | * | 7/1989 | DeMeester et al. ......... 324/312 |

(Continued)

OTHER PUBLICATIONS

"A Primer on Medical Device Interactions with Magnetic Resonance Imaging Systems", CDRH Magnetic Resonance Working Group, U.S. Food and Drug Administration—Center for Devices and Radiological Health website, released for comment on Feb. 7, 1997.

"Magnetic Resonance Angiography (MRA), A Brief Overview", Greg Brown, SMRT Royal Adelaide Hospital (www.users.on.net/vision/papers/basicMRA/MRA_Intro.htm, prepared in Sep. 1997.

"CAR Standards for Magnetic Resonance Imaging" reviewed by Magnetic Resonance Imagining Expert Advisory Panel: Pierre Bourgouin, MD, Chair; John May, MD; Blake McCarthy, MD; Pierre Milette, MD; Peter Poon, MD and approved Jun. 1999 (www.car.ca/standards/mri.htm).

"Automated Bolus Chase Peripheral MR Angiography: Initial Practial Experiences and Future Directions of This Work–In–Progress", Vincent B. Ho, MD; Peter L. Choyke, MD; Thomas K.F. Foo, PhD; Marueen N. Hood, BS; Donald L. Miller, MD; Julianna M. Czum, MD; Alex M. Aisen, MD, Journal of Magnetic Resonance Imaging 10:376–388 (1999).

*Primary Examiner*—Eleni Mantis Mercader
(74) *Attorney, Agent, or Firm*—Welsh & Katz, Ltd.

(57) ABSTRACT

A method and apparatus are provided for forming a magnetic resonance angiographic image of a human body. A plurality of spatially non-selective radio-frequency pulses and a plurality of different combinations of phase-encoding gradients are applied to the human body, that are temporally non-coincident with the radio-frequency pulses and where each combination includes a pulse value in a slice selective direction and a pulse value in an in-plane direction and magnetic resonance imaging data are detected. A slice processor and/or a thickness processor identify the presence, location and/or thickness of a body portion of the human body. Identification of a body portion in a first imaging volume becomes the basis of application of a second plurality of spatially non-selective radio-frequency pulses to a second imaging volume of the human body.

15 Claims, 2 Drawing Sheets

U.S. PATENT DOCUMENTS

| | | | |
|---|---|---|---|
| 4,884,029 A | * 11/1989 | Sattin | 324/309 |
| 5,167,232 A | 12/1992 | Parker et al. | |
| 5,239,591 A | * 8/1993 | Ranganath | 382/128 |
| 5,368,033 A | * 11/1994 | Moshfeghi | 600/419 |
| 5,433,196 A | 7/1995 | Fiat | |
| 5,570,404 A | * 10/1996 | Liang et al. | 378/8 |
| 5,584,293 A | * 12/1996 | Darrow et al. | 600/410 |
| 5,631,560 A | 5/1997 | Machida | |
| 5,810,728 A | * 9/1998 | Kuhn | 600/410 |
| 5,830,143 A | 11/1998 | Mistretta et al. | |
| 5,842,989 A | 12/1998 | Zur | |
| 5,881,728 A | 3/1999 | Mistretta et al. | |
| 5,924,987 A | 7/1999 | Meaney et al. | |
| 5,928,148 A | * 7/1999 | Wang et al. | 600/420 |
| 6,037,771 A | 3/2000 | Liu et al. | |
| 6,043,654 A | 3/2000 | Liu et al. | |
| 6,137,291 A | 10/2000 | Szumowski et al. | |
| 6,167,293 A | * 12/2000 | Chenevert et al. | 600/420 |
| 6,201,986 B1 | 3/2001 | Riederer et al. | |
| 6,228,544 B1 | 5/2001 | Ota | |
| 6,230,040 B1 | * 5/2001 | Wang et al. | 600/415 |
| 6,249,694 B1 | 6/2001 | Foo et al. | |
| 6,259,940 B1 | 7/2001 | Bernstein et al. | |
| 6,268,730 B1 | 7/2001 | Du | |
| 6,275,035 B1 | * 8/2001 | Debbins et al. | 324/307 |
| 6,275,721 B1 | * 8/2001 | Darrow et al. | 600/410 |
| 6,295,465 B1 | 9/2001 | Simonetti | |
| 6,311,085 B1 | * 10/2001 | Meaney et al. | 600/420 |
| 6,397,096 B1 | * 5/2002 | Liu et al. | 600/419 |
| 6,408,201 B1 | * 6/2002 | Foo et al. | 600/410 |
| 2001/0027262 A1 | 10/2001 | Mistretta et al. | |
| 2001/0027265 A1 | 10/2001 | Prince | |
| 2003/0016850 A1 | * 1/2003 | Kaufman et al. | 382/128 |
| 2003/0052875 A1 | * 3/2003 | Salomie | 345/419 |
| 2003/0053669 A1 | * 3/2003 | Suri et al. | 382/130 |

\* cited by examiner

US 6,901,282 B2

SCOUTLESS WHOLE-BODY IMAGING WITH FAST POSITIONING

This application is a continuation-in-part of U.S. patent application Ser. No. 09/999,583 filed on Oct. 25, 2001 (pending).

FIELD OF THE INVENTION

The field of the invention relates to computed tomography and more particularly to magnetic resonance imaging.

BACKGROUND OF THE INVENTION

Arterial diseases and injuries are common and have severe consequences including amputation or death. Atherosclerosis, in fact, is a major problem in the aged population, particularly in the developed countries.

Atherosclerosis of the lower extremities (often, otherwise, referred to as peripheral vascular disease) is a common disorder that increases with age, ultimately affecting more than 20% of those people over the age of 75. Lesions resulting from atherosclerosis are often characterized by diffuse and multi focal arterial stenosis and occlusion.

Peripheral vascular disease often manifests itself as an intermittent insufficiency or claudication of blood flow in calf, thigh or buttocks. The symptoms of claudication often result from an inability of the body to increase blood flow during exercise.

In more extreme cases of peripheral vascular disease, blood flow of even a resting patient may be insufficient to meet basal metabolic needs of the extremities. Symptoms of blood flow insufficiency in these areas may include pain in the forefoot or toes or, in extreme cases, non-healing ulcers or gangrene in the affected limb.

One of the most effective means of diagnosing and treating atherosclerosis is based upon the use of magnetic resonance angiography (MRA) to create images of portions of the vascular system. As is well known, MRA is a form of magnetic resonance imaging (MRI) which is especially sensitive to the velocity of moving blood. More specifically, MRA generates images by relying upon an enhanced sensitivity to a magnitude and phase of a signal generated by moving spins present within flowing blood.

MRA, in turn, can be divided into three types of categories: 1) time of flight (TOF) or inflow angiography; 2) phase contrast (PC) angiography (related to the phase shift of the flowing proton spins) and 3) dynamic gadolinium enhanced (DGE) MRA. While the three types of MRA are effective, they all suffer from a number of deficiencies.

The predominant deficiency of all three types of existing MRA techniques relates to speed of data collection. For example, patient motion is known to significantly degrade image quality of TOF MRA. To avoid image degradation, a patient undergoing DGE MRA is typically required to hold his breath during data collection. PC MRA relies upon the use of long time-to-echo (TE) intervals for signal sampling that result in other T2 effects that tend to degrade image quality. Because of the importance of MRA, a need exists for MRA methods that are less reliant upon time or upon movement of the patient.

SUMMARY

A method and apparatus are provided for forming a magnetic resonance angiographic image of a human body. The method includes the steps of applying a plurality of spatially non-selective radio-frequency pulses of a relatively constant magnitude to the body applying a plurality of substantially identical, frequency encoding gradient pulse sequences to the body that correspond in number to the plurality of radio frequency pulses in a fixed relationship and that are temporally non-coincident with the radio-frequency pulses applying a plurality of different combinations of phase-encoded gradients to the body that correspond to the plurality of radio frequency pulses in a fixed relationship, that are temporally non-coincident with the radio-frequency pulses and where each combination further comprises a first pulse value in a slice selective direction and a second pulse value an in-plane direction and detecting magnetic resonance imaging data from the body based upon the spatially non-selective radio-frequency pulses and varied phase-encoded gradients.

DETAILED DESCRIPTION OF AN ILLUSTRATED EMBODIMENT

Figure 1:
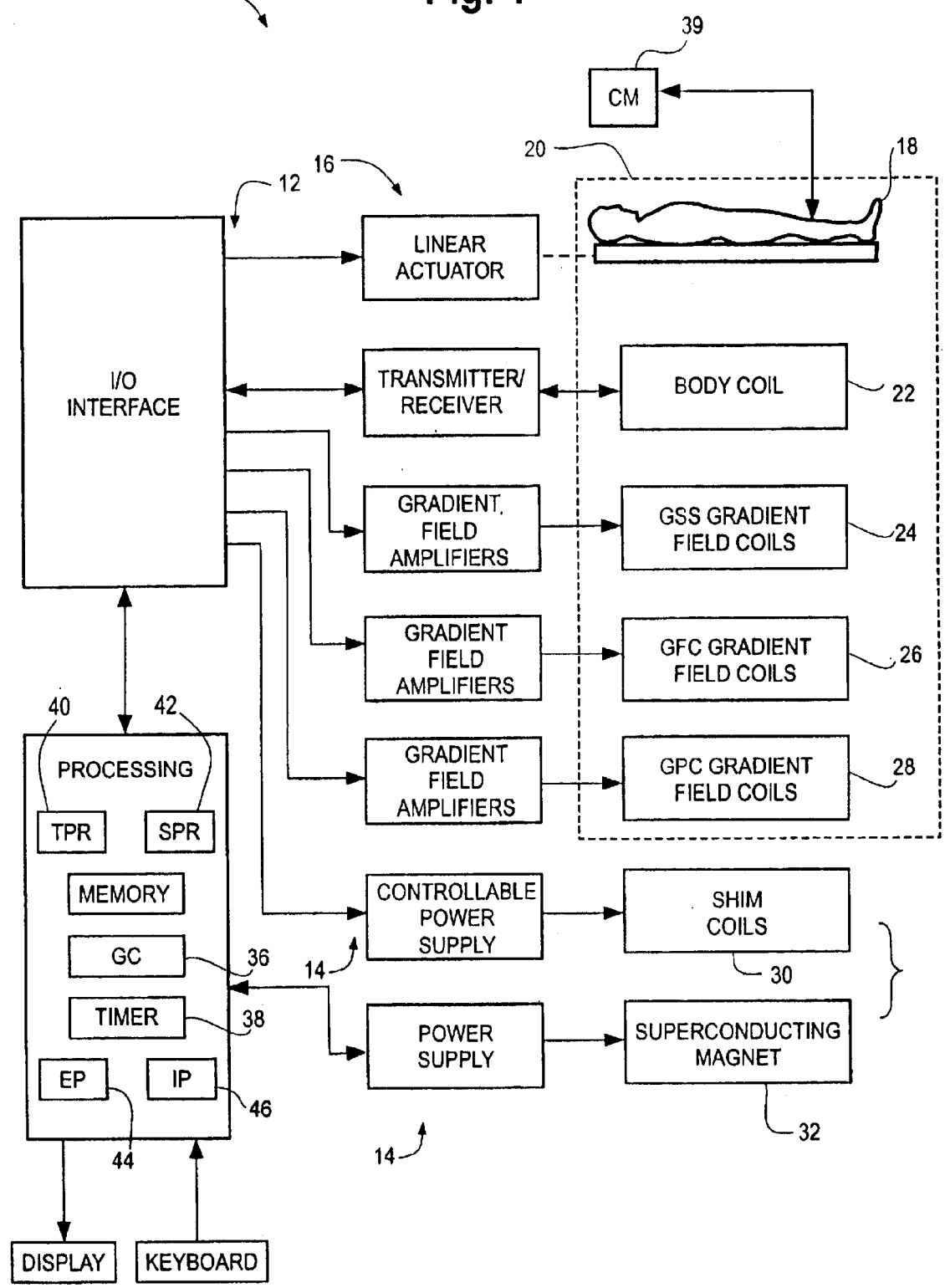
FIG. 1 is a block diagram of a magnetic imaging angiography system in accordance with an illustrated embodiment of the invention.

FIG. 1 is a block diagram of a magnetic resonance imaging system 10 under an illustrated embodiment of the invention. While the system 10 is amenable to a number of different modes of use, one illustrated method provides faster contrast-enhanced multi-station magnetic resonance angiography (MRA), that eliminates the need for the acquisition of scout images and/or manual positioning of the patient for collecting specific imaging volumes. As used herein, the term "scout images" refers to coarse images collected specifically for the purpose of aligning imaging volumes among imaging stations.

Figure 2:
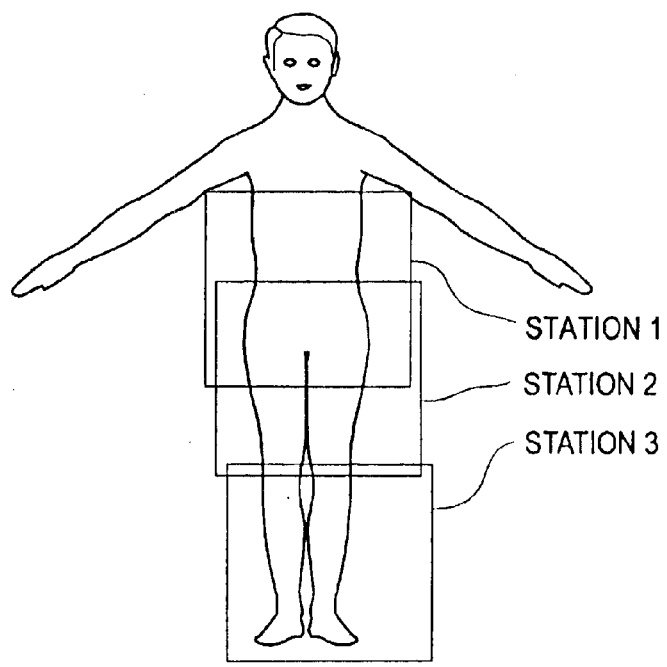
FIG. 2 depicts a series of imaging stations that may be used by the system of FIG. 1.

With conventional moving table MRA, MRA image data is collected at each of a number (two or more) of imaging Stations (FIG. 2) in order to follow the passage of an intravenously administered contrast agent. Because the data are typically acquired over a volume of finite thickness that is smaller than the thickness of the body part, the three-dimensional (3D) imaging volume must be carefully selected (i.e., the imaging equipment must be carefully positioned) so as to encompass all the major arteries. The process of acquiring scout images to locate the arteries for positioning the equipment and then setting up the 3D acquisition at each imaging station may require many minutes, which is inefficient, uncomfortable for the patient, and may result in motion artifacts. Moreover, imperfect positioning of the imaging equipment may result in the false impression of vessel occlusion.

The system 10 of FIG. 1 uses a unique combination of techniques discussed in more detail below in order to permit the essentially foolproof acquisition of MRA data from multiple stations without the need for obtaining scout images to locate vessels or for manual positioning of each 3D imaging volume within an imaging space. This may be accomplished by acquiring the imaging data through the entire thickness of the body, rather than through only a finite thickness of the body.

The imaging data acquired through the thickness of the body by the system 10 may be obtained through relatively thin slices. Because the speed of acquisition is relatively fast, the total time for data acquisition over the three imaging stations of FIG. 2 may be less than 30 seconds. Because the data acquisition time is relatively short, patient motion becomes less of a concern. T1 weighting may be used in conjunction with the acquired data to discriminate contrast-enhanced blood vessels. Arteries may be selectively displayed without enhancement of veins.

As shown in FIG. 1, the system 10 for collecting MRA images of a patient 18 may include three subsystems 12, 14, 16. A patient movement subsystem 16 may be used to move the patient 18 among the imaging stations of FIG. 2 and to control the movement of a patient transport table within a scanning zone 20 of the system 10. A signal processing subsystem 14 may provide the magnetic fields and control transmission and detection of radio frequency (RF) signals from resonant atoms within the patient 18. A control subsystem 12 may provide programming and control of the first and second subsystems 14, 16.

The first and second subsystems 14, 16 may be conventional. A body coil 22 may be used for the transmission of RF pulses and to detect resonant signals. First, second and third gradient field coils 24, 26, 28 may be used to create and control gradient magnetic fields within the body coil 22. A superconducting magnet 32 and shim coils 30 may be used to provide a static magnetic field within the scanning zone 20.

In order to prepare the patient 18 for angiography, a contrast agent (e.g., gadolinium-chelate) 34 may be injected into the patient 18. The contrast agent 34 may be administered using any appropriate method (e.g., hypodermic needle). As the contrast agent 34 passes through the body, the patient movement subsystem 16 may move the patient 18 through a series of overlapping positions, such as those shown in FIG. 2.

To collect image data through the thickness of the body, a spatially non-selective RF pulse may be applied through the body coil 22 without the necessity for any, or only a relatively low level, slice selective gradient Gss that would otherwise be applied at the same time as the RF pulse. Because of the relatively constant frequency of the spatially non-selective RF pulse and the absence of phase-encoding gradients, the spatially nonselective RF pulse need only be a fraction of the length of a spatially selective RF pulse. Also, because of the short duration of the spatially non-selective RF pulse, the minimum repetition time is much shorter. Repetition rates of less than 3 milliseconds (ms), in fact, are possible using the spatially non-selective RF pulse.

Figure 3:
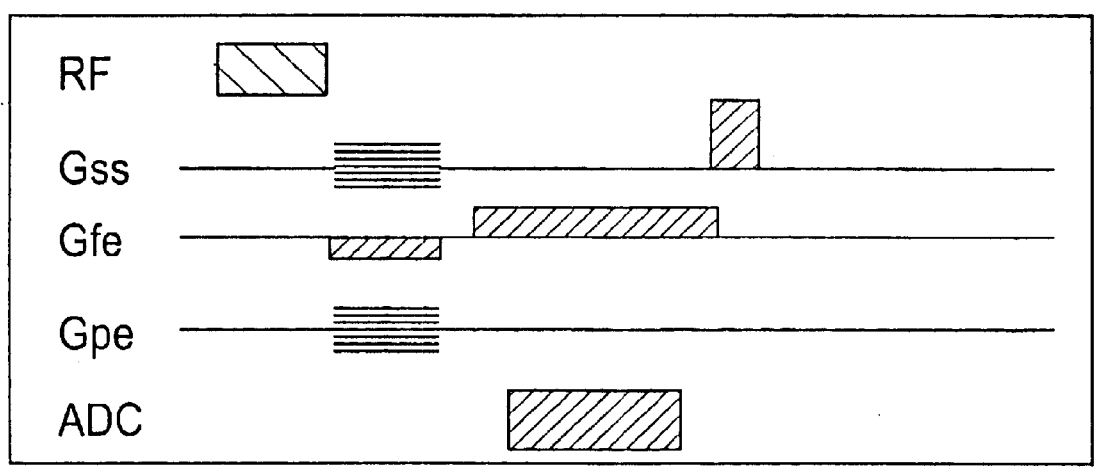
FIG. 3 depicts a pulse sequence that may be used by the system of FIG. 1.

FIG. 3 depicts a 3D gradient-echo pulse sequence using the spatially non-selective RF pulse. The RF pulse may remain relatively constant among pulse sequences, as does the frequency encoding gradient Gfe and the timing of data collection through the analog-to-digital converter (ADC). The absence of any slice selection gradient during the RF pulse should be specifically noted in FIG. 3. The absence of any slice selection gradient during the RF pulse allows the RF pulse to be spatially non-selective in its effect on resonant atoms.

In order to collect data based upon each spatially non-selective RF pulse of FIG. 3, the phase-encoding gradient Gss, in the slice direction and the phase-encoding gradient Gpe in the in-plane direction may be varied by a gradient controller 36 in some predetermined manner. As used herein, varying the phase-encoding gradients Gss, Gpe means applying a number of phase-encoded gradient combinations among pulse sequences (after the RF pulse has ended) in the slice selective and in-plane directions while collecting data for each combination under conditions of a constant frequency-encoding gradient Gfe and constant three-dimensional spatially non-selective frequency pulses RF among the pulse sequences.

For example, the full-scale range of the phase-encoding gradients in the slice and also the in-plane directions may each be divided up into a number of incremental steps (e.g., 64–256). Data may be collected by selecting a value for the first phase-encoding gradient while varying a value of the second phase-encoding gradient. After collecting data over a range of values for the second phase-encoding gradient, a new value may be selected for the first phase-encoding gradient and the process may be repeated until a full complement of data has been collected. A full complement of data may mean collecting data for each combination of phase-encoded gradients within an imaging area.

As a further, more detailed example, a lowest relative value may be chosen for the first phase-encoding (e.g., the slice selective) gradient. Next a lowest relative value of the second phase-encoding (e.g., the in-plane) gradient may be selected and a first set of data may be collected using these two phase-encoding values via the use of the sequence of FIG. 3. Following collection of the first set of data, the phase-encoding value of the second phase-encoding gradient may be incremented and a second set of data may be collected.

The process of incrementing the second phase-encoding gradient value (and collecting data sets) may be repeated until a maximum gradient value is achieved for the second phase-encoding gradient. Once the maximum value is achieved for the second phase-encoding gradient, the first phase-encoding gradient may be incremented and the process may be repeated. The process may be repeated by as many steps that it takes to increment the first phase-encoding gradient from a minimum value to a maximum value.

The process of incrementing phase-encoded gradient levels in both the slice and in-plane directions may be continued until data collection for a first body portion (e.g., the body portion referred to as Station 1 in FIG. 2) has been completed. The imaging system 10 may then wait a predetermined time period measured by a timer 38 for the contrast medium to reach the next station. Following the predetermined time period, the system 10 may move to overlapping Station 2 and the process may be repeated. Following data collection and another predetermined time period, the system 10 may move to Station 3 and the process may be again repeated. Following collection of imaging data, an imaging processor 46 may form a set of images that corresponds to the collected data.

Because of the ability of the system 10 to form an image slice across the entire thickness of the body, it is possible to automatically correlate a slice collected at one station with a slice collected at another station. The fact that the stations overlap also simplifies the comparison because correlation may simply involve identifying the slice of one station that substantially matches a slice collected through another adjacent station.

In order to further enhance processing efficiency, the system 10 may function to identify the presence, location and thickness of any body portions of the patient 18 within each slice. Once identified, a thickness processor 40 of the system 10 may function to limit image processing to the location and to the thickness of any identified body portions.

As a first step, the system 10 may perform a coarse scan of each slice. A slice processor 42 may then determine whether the slice passes through any part of the body of the patient 18. The slice processor 42 may make this determination by comparing a resonance value of each pixel of the slice with a threshold value. If the resonance values of each pixel of the slice exceed the threshold value (indicating that the slice does not pass through any body portions), then the system 10 may discard the slice.

If it is determined that some part of the slice passes through the patient 18, then the system 10 may group the pixels of the body portion(s) and identify an outer boundary of the body portion(s) within the slice. As a first step, a thickness processor 40 may determine a center of the body part (i.e., the center of each significant group of pixels that do not exceed the threshold value). This may be performed using a simple grouping and weighting algorithm.

The thickness processor 40 may then calculate the thickness of each body portion based upon average resonance values of the pixels within the body portions of the slice. To determine an average value, the processor 40 begins by selecting a value at a center of the body portion as a first average value and averaging outwards. As each new pixel value is examined, it is compared with the average. If it is within a threshold value of the average, it may be incorporated into the average. If it is not, then the pixel location and value may be segregated as a potential boundary area of the body.

A line tracing routine may attempt to connect boundary pixel locations that exceed the threshold (where each boundary pixel lies adjacent other pixel locations that do not exceed the threshold). If the line tracing routine is able to successfully trace-a continuous line around the center of the slice, then the line is assumed to define the boundary of the portion of the body 18 within the slice. The diameter of the traced boundary line defines the thickness of the body portion within the slice.

The voltage of the spatially non-selective RF pulse may be adjusted to produce a relative large flip-angle (e.g., 15–60 degrees). Further, the large number of phase-encoding steps have been found to provide relatively thin sections despite the relatively large excitation volume.

To further improve imaging integrity a number of different types of saturation pulses may be applied. For example, a non-selective RF saturation pulse may be applied at regular intervals to preferentially reduce signal intensity from non-vascular structures. Alternatively, a chemical shift-selective RF saturation pulse may be applied at regular intervals to preferentially reduce the signal intensity from fat-containing tissue.

Further, gradient or RF spoiling may be used to disperse transverse magnetization. The dispersion of transverse magnetization may be used as a method of improving T1 contrast.

In-plane spatial information may be handled in any of a number of ways. Conventional methods may be used in some cases, or the in-plane spatial information may be encoded by an encoding processor 44 using non-standard techniques. Such techniques may include, but are not limited to, vastly undersampled projection reconstruction (VIPR) Hadamard encoding and wavelet encoding.

A number of previously known imaging techniques may also be used to further enhance imaging integrity. For example, partial Fourier imaging may be used where appropriate. Alternatively, parallel imaging (e.g., SENSE or SMASH-like techniques) may also be used. A rectangular field of view may be imposed to optimize imaging data.

Data may be acquired repeatedly so as to create a series of temporally-distinct MR angiograms spanning parts or all of the time course of the passage of the contrast agent through the vessels of interest. This can be accomplished by any of a variety of techniques, including the use of a very short repetition time, partial k-space acquisition, or other methods of k-space coverage such as "TRICKS" or "keyhole imaging" methods.

Further, image enhancement may be used to improve upon the data actually collected. For example, data may be interpolated along the slice direction to enhance small objects and eliminate discontinuities.

Before and after images may also be used. Acquisition of a series of "mask" images may be collected before administration of contrast material. The mask images may be used to mask out unwanted structures.

Further, the use of measured data values may also be used for image enhancement. Magnitude or complex data subtraction may be used to highlight contrasted-enhanced areas over areas without contrast enhancement.

Accurate table positioning has been recognized as an important factor in image subtraction. However, since the images of adjacent stations can be easily correlated, image subtraction becomes relatively simply using the data provided by the system 10.

Image subtraction has been shown to provide improved arterial imaging by eliminating spurious signal artifacts (e.g., phase wrap, venous in-flow enhancement, etc.). Image subtraction has been found to have great value in the imaging of the distal tibioperoneal arteries.

In another embodiment, the patient 18 may remain stationary and the movement subsystem 16 may move the scanning zone 20. Alternatively, the patient 18 moves, but the radio frequency antenna (e.g., surface coil or phased array coil) 22 used to receive the signal remains stationary.

A specific embodiment of a method and apparatus for performing magnetic resonance angiography has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. An apparatus for forming a magnetic resonance angiographic image of a human body comprising:

means for applying a first plurality of spatially non-selective radio-frequency pulses to a first imaging volume of the human body;

means for applying a first plurality of combinations of magnitude of phase-encoding gradients in slice-selective and in-plane directions through the first imaging volume of the human body in conjunction with application of the first plurality of spatially non-selective radio-frequency pulses;

means for detecting first magnetic resonance imaging data from the first imaging volume of the human body based upon the first plurality of spatially non-seleqtive radio-frequency pulses and the applied first plurality of combinations of magnitude of phase-encoding gradients;

means for identifying a location of a body portion of the human body within the first imaging volume based upon the detected first magnetic resonance imaging data;

means for applying a second plurality of spatially non-selective radio-frequency pulses to a second imaging volume of the human body based upon the identified location of the body portion;

means for applying a second plurality of combinations of magnitude of phase-encoding gradients in slice-selective and in-plane directions through the second imaging volume of the human body in conjunction with application of the second plurality of spatially non-selective radio-frequency pulses;

means for detecting magnetic resonance imaging data from the second imaging volume of the human body based upon the second plurality of spatially non-selective radio-frequency pulses and second plurality of combinations of magnitude of phase-encoding gradients; and means for forming the magnetic resonance angiographic image of the second imaging volume.

2. The apparatus for forming a magnetic resonance angiographic image as in claim 1 further comprising means for injecting a contrast agent into the human body.

3. The apparatus for forming a magnetic resonance angiographic image as in claim 1 further comprising means for encoding in-plane spatial information using one of the group consisting of vastly undersampled projection reconstruction, Hadamard encoding and wavelet encoding.

4. The apparatus for forming a magnetic resonance angiographic image as in claim 1 further comprising means for deleting any imaging slices within the first imaging volume without the identified body portion of the human body.

5. A method of forming a magnetic resonance angiographic image of a human body comprising the steps of:

applying a first plurality of spatially non-selective radio-frequency pulses to a first imaging volume of the human body;

applying a first plurality of combinations of magnitude of phase-encoding gradients in slice-selective and in-plane directions through the first imaging volume of the human body in conjunction with application of the first plurality of spatially pon-selective radio-frequency pulses;

detecting first magnetic resonance imaging data from the first imaging volume of the human body based upon the first plurality of spatially non-selective radio-frequency pulses and the first plurality of combinations of magnitude of phase-encoding gradients;

identifying a location of a body portion of the human body within the first imaging volume based upon the detected first magnetic resonance imaging data;

applying a second plurality of spatially non-selective radio-frequency pulses to a second imaging volume of the human body based upon the identified location of the body portion;

applying a second plurality of combinations of magnitude of phase-encoding gradients in slice-selective and in-plane directions through the second imaging volume of the human body in conjunction with application of the second plurality of spatially non-selective radio-frequency pulses;

detecting magnetic resonance imaging data from the second imaging volume of the human body based upon the second plurality of spatially non-selective radio-frequency pulses and second plurality of combinations of magnitude of phase-encoding gradients; and forming the magnetic resonance angiographic image of the second imaging volume.

6. The method of forming a magnetic resonance angiographic image as in claim 5 further comprising injecting a contrast agent into the human body.

7. The method of forming a magnetic resonance angiographic image as in claim 5 further comprising encoding in-plane spatial information using one of the group consisting of vastly undersampled projection reconstruction, Hadamard encoding and wavelet encoding.

8. The method of forming a magnetic resonance angiographic image as in claim 5 further comprising deleting any imaging slices within the first imaging volume without the identified body portion of the human body.

9. The method of forming a magnetic resonance angiographic image as in claim 5 further comprising moving the human body relative to a stationary radiofrequency antenna that detects the first and second magnetic resonance imaging data.

10. An apparatus for forming a magnetic resonance angiographic image of a human body comprising:

a body coil adapted to apply a first plurality of spatially non-selective radio-frequency pulses to a first imaging volume of the human body and a second plurality of spatially non-selective radio-frequency pulses to a second imaging volume of the human body;

a controller adapted to apply a first plurality of combinations of magnitude of phase-encoding gradients in a first slice-selective and a first in-plane directions through the first imaging volume of the human body in conjunction with application of the first plurality of spatially non-selective radio-frequency pulses;

a slice processor adapted to identify a presence and location of a body portion of the human body within the first imaging volume and to delete any imaging slices within the first imaging volume without the identified body portion of the human body;

the controller adapted to apply a second plurality of combinations of magnitude of phase-encoding gradients in a second slice-selective and a second in-plane directions through the second imaging volume of the human body in conjunction with application of the second plurality of spatially non-selective radio-frequency pulses based upon the identified location of the body portion;

a receiver adapted to detect magnetic resonance imaging data from the first and second imaging volumes of the human body based upon the first and second plurality of spatially non-selective radio-frequency pulses and applied first and second plurality of combinations of magnitude of phase-encoding gradients;

a signal processing subsystem adapted to position the human body and acquire imaging data of the first and second imaging volumes; and an imaging processor for forming the magnetic resonance angiographic image of the second imaging volume.

11. The apparatus for forming a magnetic resonance angiographic image as in claim 10 comprising a Gss gradient field coil adapted to vary the first and second plurality of combinations of magnitude of the first and second phase-encoding gradients in the first and second slice-selective direction after each of the first and second plurality of spatially non-selective radio frequency pulses.

12. The apparatus for forming a magnetic resonance angiographic image as in claim 10 comprising a Gpe gradient field coil adapted to vary the first and second plurality of combinations of magnitude of the first and second phase-encoding gradients in the first and second in-plane directions after each of the first and second plurality of spatially non-selective radio-frequency pulses.

13. The apparatus for forming a magnetic resonance angiographic image as in claim 10 comprising a gradient controller adapted to very the first and second plurality of combinations of magnitude of the phase-encoding gradients in the first and second slice-selective directions and in the first and second in-plane directions after each of the first and second plurality of spatially non-selective radio-frequency pulses.

14. The apparatus for forming a magnetic resonance angiographic image as in claim 10 further comprising an encoding processor adapted to encode in-plane spatial information using one of the group consisting of vastly undersampled projection reconstruction, Hadamard encoding and wavelet encoding.

15. The apparatus for forming a magnetic resonance angiographic image as in claim 10 further comprising a thickness processor adapted to limit imaging processing to areas with the identified body portions of the human body.

* * * * *